United States Patent [19]

Tomita

[11] Patent Number: 5,650,360
[45] Date of Patent: Jul. 22, 1997

[54] METHOD FOR MANUFACTURING SEMICONDUCTOR DEVICE WITH MULTILAYER WIRING STRUCTURE, INCLUDING IMPROVED STEP OF FORMING INSULATING FILM WHICH COVERS WIRING LAYER

[75] Inventor: Ken-ichi Tomita, Kawasaki, Japan

[73] Assignee: Kabushiki Kaisha Toshiba, Kawasaki, Japan

[21] Appl. No.: 598,958

[22] Filed: Feb. 9, 1996

[30] Foreign Application Priority Data

Feb. 15, 1995 [JP] Japan ................................. 7-026922

[51] Int. Cl.$^6$ ................................................ H01L 21/02
[52] U.S. Cl. .......................... 437/235; 437/225; 437/231
[58] Field of Search ................................ 437/231, 235, 437/DIG. 982, DIG. 978, 225

[56] References Cited

U.S. PATENT DOCUMENTS

| | | | |
|---|---|---|---|
| 5,192,714 | 3/1993 | Suguro et al. | 437/195 |
| 5,382,545 | 1/1995 | Hong | 437/235 |
| 5,444,023 | 8/1995 | Homma | 437/231 |

OTHER PUBLICATIONS

Dobson et al., "Advanced SiO$_2$ Planarization Using Silane and H$_2$O$_2$", Semiconductor International, pp. 85–88, 1994.
Matsuura et al., "Novel Self-planarizing CVD Oxide for Interlayer Dielectric Applications", IEEE, pp. 117–120, 1994.

*Primary Examiner*—Charles L. Bowers, Jr.
*Assistant Examiner*—Lynne A. Gurley
*Attorney, Agent, or Firm*—Finnegan, Henderson, Farabow, Garrett & Dunner, L.L.P.

[57] ABSTRACT

The present invention provides a method for manufacturing a semiconductor device having a multilayer wiring structure, in which the step of forming an insulating film for covering a wiring layer is improved. In the method a wiring pattern is formed on an insulating film provided on a semiconductor substrate. SiH$_4$ gas and H$_2$O$_2$ are introduced into a reaction chamber in which the semiconductor substrate provided with the wiring pattern is placed, and are reacted with each other under a negative pressure of 665 Pa or less at a temperature falling within a range from $-10°$ C. to $+10°$ C., thereby forming a reflow SiO$_2$ film of a reflow configuration on the wiring pattern such that it does not completely cover the wiring pattern, and a plasma CVD insulating film is continuously deposited on the reflow SiO$_2$ film on the semiconductor substrate by plasma CVD under a negative pressure.

8 Claims, 1 Drawing Sheet

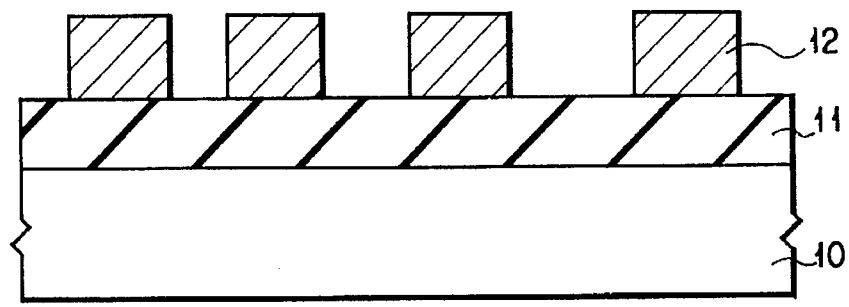
F I G. 2A
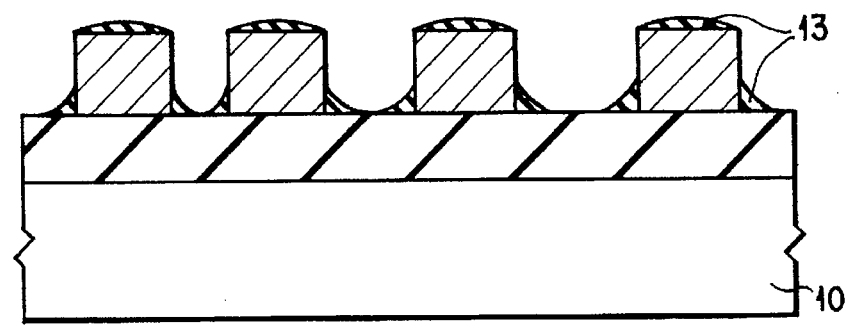
F I G. 2B
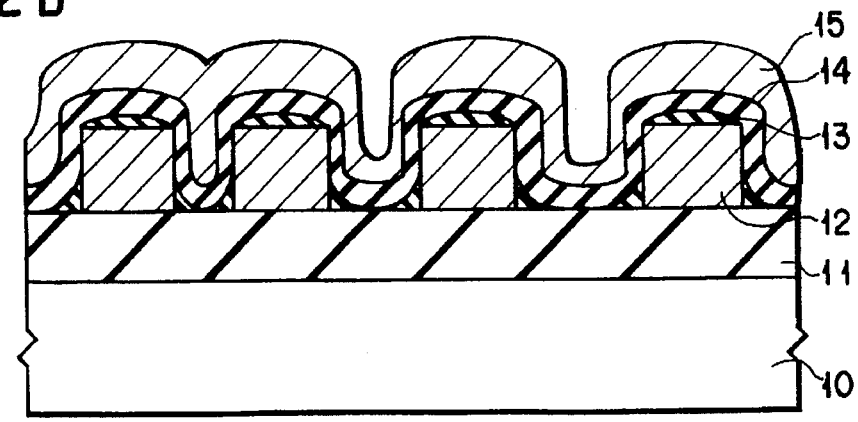
F I G. 2C

METHOD FOR MANUFACTURING SEMICONDUCTOR DEVICE WITH MULTILAYER WIRING STRUCTURE, INCLUDING IMPROVED STEP OF FORMING INSULATING FILM WHICH COVERS WIRING LAYER

BACKGROUND OF THE INVENTION

1. Field of the Invention

This invention relates to a method for manufacturing a semiconductor device with a multilayer wiring structure, including the improved step of forming an insulating film such as an interlayer insulating film, or a top passivation film, which covers a wiring layer.

2. Description of the Related Art

In accordance with increases in the integration of semiconductor devices, techniques for forming multiple layers of wiring materials on a substrate have been developed. In the techniques, a technique for planarising an interlayer insulating film or a top passivation film has been regarded as important.

The conventional step of forming multilayer wiring will be explained with reference to FIG. 1.

First, an element region and a contact region, which are not shown, are formed in a semiconductor substrate 30, and then a lower insulating film 31 with a thickness of about 1000 nm is formed on the resultant structure by the CVD under normal pressure.

Subsequently, contact holes are formed in the lower insulating film 31 to connect the wiring to the element and contact regions.

A first wiring material (made of aluminum, which contains, for example, 1% Si and 0.5% Cu) for a lower wiring layer is deposited and patterned by photolithography and RIE (Reactive Ion Etching), thereby forming lower wires 32.

The lower wires 32 have a thickness of about 900 nm and are arranged with a pitch of about 600 nm at minimum.

Subsequently, a plasma CVD insulating film 33 with a thickness of about 800 nm is formed on the resultant structure by plasma CVD.

However, where the wires 32 are so thinned in a highly integrated LSI device, the above-described usual plasma CVD cannot sufficiently supply reactive gas or inject ions to fine spaces defined between extremely thin wires. Accordingly, the CVD insulating film 33 cannot sufficiently grow in such spaces.

In particular, those portions of the insulating film 33, which are deposited on the corners of the fine spaces between the thin wires, are very thin and may have overhanging cross sections.

More specifically, as is shown in FIG. 1, a void 34 may be formed between overhanging portions 33a and 33b of the plasma CVD insulating film 33. Further, the overhanging portions of the insulating film 33 may adversely affect deposition of a second wiring material for an upper wiring layer, or patterning of the upper wiring layer, thereby causing a serious defect such as disconnection of upper wires due to defective forming of the upper wiring layer.

These problems indicate that the plasma CVD process as a process for forming an interlayer insulating film has reached its technical limit as the wires have extremely been refined.

In addition, where the thickness of the CVD insulating film 33 is partially thin in the spaces between fine wires, the quality of thin portions of the film 33 is low because of insufficient supply of reactive gas or insufficient ion injection.

Accordingly, if the CVD process is used to form a top passivation film, moisture, alkali ions, etc. may enter the LSI device from the outside through those corners of the spaces between the wires located under the top passivation film, which are not sufficiently insulated by the plasma CVD insulating film, thereby degrading the reliability of the device.

An APL (Advanced Planarisation Layer) process as one of techniques for planarising an interlayer insulating film is disclosed, for example, in a document "Matsuura et al. IEEE Tech. Dig., p 117, 1994", and in a document "Semiconductor International, DECEMBER 1994, pp 85–88".

In the APL process, $SiH_4$ gas is reacted with $H_2O_2$ gas, as an oxidizing agent, at a low temperature of e.g. 0° C. under a vacuum pressure, to thereby form on lower wires a reflow $SiO_2$ film as an interlayer insulating film.

This process is advantageous in that deposition of an insulating film in the spaces between the lower wires and planarisation of the insulating film can be performed at the same time, and hence in that a multilayer wiring structure can be formed at low cost by virtue of the simultaneous deposition and planarisation.

However, as explained above, the interlayer insulating film obtained by the above-described conventional plasma CVD process cannot sufficiently grow in the spaces defined between lower thin wires, and may have portions of overhanging cross sections. As a result, a void may be formed in the spaces between the wires, and serious defects due to defective forming of the upper wiring layer, such as breakage of upper wires, short-circuiting in the wiring structure, etc., may occur.

Moreover, as explained above, in the top passivation film obtained by the conventional plasma CVD process, moisture, alkali ions, etc. may well enter the device from the outside through those corners of the spaces between the wires located under the top passivation film, which are not sufficiently insulated by the plasma CVD insulating film, thereby degrading the reliability of the device.

SUMMARY OF THE INVENTION

The invention has been developed in light of the above-described problems, and it is the object of the invention to provide a method for manufacturing a semiconductor device with a multilayer wiring structure, in which method the step of forming an insulating film for covering wires formed of a wiring layer is improved so as to prevent the wires from having an insufficiently insulated lower side portion because of insufficient growth of the insulating film thereon, thereby preventing degradation of film quality and imparting a highly planarised surface to the insulating film to enhance the reliability of the resultant semiconductor device.

To attain the object, there is provided a method for manufacturing a semiconductor device having a multilayer wiring structure, in which the step of forming an insulating film for covering a wiring layer is improved, comprising the steps of:

forming a wiring pattern on an insulating film provided on a semiconductor substrate;

forming a reflow film by step of introducing $SiH_4$ gas and $H_2O_2$ into a reaction chamber in which the semiconductor substrate provided with the wiring pattern is placed, and by reacting them with each other under a negative pressure of 665 Pa or less at a temperature falling within a range from −10° C. to +10° C., thereby forming a reflow $SiO_2$ film of a reflow configuration on the wiring pattern such that it does not completely cover the wiring pattern; and forming a plasma CVD insulating film by depositing continuously a plasma CVD insulating film on the reflow SiO$_2$ film on the semiconductor substrate by plasma CVD under a negative pressure.

By virtue of the above-described steps, sufficient amounts of reactive gases and an ion gas can be applied to lower side portions of the wires, and the plasma CVD insulating film sufficiently can grow even at the lower side portions, even where the wires are extremely thin in accordance with high integration of the LSI device. Therefore, it is not possible that the plasma CVD insulating film formed on the wires and on those portions of the semiconductor substrate which are located between each adjacent pair of the wires has overhanging cross sections.

Thus, the present invention provides a method for manufacturing a semiconductor device with a multilayer wiring structure, in which method the step of forming an insulating film for covering wires formed of a wiring layer is improved so as to prevent the wires from having an insufficiently insulated lower side portion because of insufficient growth of the insulating film thereon, thereby preventing degradation of film quality and imparting a highly planarised surface to the insulating film to enhance the reliability of the resultant semiconductor device.

BRIEF DESCRIPTION OF THE DRAWING

The accompanying drawing, which are incorporated in and constitute a part of the specification, illustrate a presently preferred embodiment of the invention and, together with the general description given above and the detailed description of the preferred embodiment given below, serve to explain the principles of the invention.

FIG. 2A is a partially sectional view, useful in explaining a step included in a process for manufacturing multilayer wiring of a semiconductor device, according to the embodiment of the invention;

FIG. 2B is a partially sectional view, useful in explaining a step following to the step of FIG. 2A; and FIG. 2C is a partially sectional view, useful in explaining a step following to the step of FIG. 2B.

DETAILED DESCRIPTION OF THE PREFERRED EMBODIMENT

Figure 1:
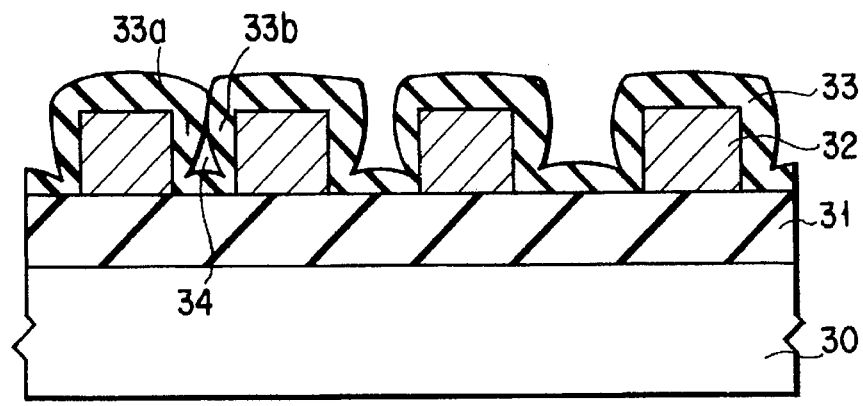
FIG. 1 is a sectional view, showing an example of a conventional process for forming multilayer wiring of a semiconductor device.

The embodiment of the invention will be explained with reference to the accompanying drawings.

FIGS. 2A–2C are partially sectional views, useful in explaining steps included in a process, according to the invention, for manufacturing a semiconductor device having a multilayer wiring structure, in which process the step for forming an insulating film covering a wiring layer is improved.

As is shown in FIG. 2A, a lower insulating film 11 with a thickness of 1000 nm is deposited by normal pressure CVD on a semiconductor substrate 10, after an element region (not shown) and a contact region (not shown) are formed in surface portions of the semiconductor substrate (e.g. silicon substrate) 10. Thereafter, contact holes (not shown) are formed in the lower insulating film for connecting the element and contact regions to a lower wiring layer formed later.

A first wiring material (e.g. aluminum containing 1% Si and 0.5% Cu) for a lower wiring layer is deposited on the resultant structure by, for example, sputtering, and then patterned by photolithography or RIE, thereby forming a lower wiring layer 12. The lower wiring layer 12 has a thickness of about 900 nm and the minimum wiring interval is about 600 nm. Subsequently, SiH$_4$ gas and H$_2$O$_2$ are introduced into a reaction chamber in which the semiconductor substrate 10 coated with the lower wiring layer is placed, and are reacted with each other under a negative pressure of 5 Torr (=5×133.322 Pa=about 665 Pa) at a temperature from −10° C. to +10° C. (e.g. 0° C.). As a result, a reflow SiO$_2$ film 13 of a reflow configuration is formed on the patterned lower wiring layer 12. In this case, the thickness of the reflow film 13 is set to such a value as allows the film not to completely cover the patterned layer 12, as is shown in FIG. 2B. For example, the thickness is about 300 nm.

The state that the film 13 does not completely cover the patterned layer 12 means the following:

At the time of coating the lower insulating film 11 and the lower wiring layer 12 with the reflow film 13 of a predetermined thickness, it is possible that those portions of the reflow film 13, which are deposited on contact portions of the lower insulating film 11 and the wires formed of the lower wiring layer 12, have concave cross sections as a result of its surface tension; that those portions of the film 13, which are deposited on the upper portions of the wires 12, have convex cross sections; and that side portions of the wires 12 are partially exposed.

The above-described thickness value is what will cause this state.

After the reflow film-forming process, a plasma CVD insulating film 14 is deposited on the reflow SiO$_2$ film 13 as shown in FIG. 2C.

To this end, SiH$_4$ gas and N$_2$O gas are mainly reacted with each other by plasma CVD at a temperature of 300° C.–400° C. (to avoid melting of the lower wires), thereby forming a plasma CVD-SiO$_2$ film 14 with a thickness of about 800 nm on the overall surface of the resultant structure.

Since sufficient amounts of reactive gases and an ion gas are applied to lower side portions of the wires, the plasma CVD insulating film 14 sufficiently grows even at the lower side portions. As a result, the resultant plasma CVD insulating film or interlayer insulating film 14 has a cross section obtained by continuously connecting smooth U-shaped sections, and hence has a highly planarised surface.

Subsequently, if necessary, the resultant semiconductor substrate is subjected to 30-minute furnace annealing performed at a high temperature of 400° C. –450° C. in the atmosphere.

Thereafter, the interlayer insulating film 14 is etched to form contact holes or via holes therein, and then a second wiring material (e.g. aluminum containing 1% Si and 0.5% Cu) is deposited and patterned, thereby forming an upper wiring layer 15.

Since the lower plasma CVD insulating film 14 has a cross section consisting of smooth U-shaped sections connected to each other on a continuous basis, breakage of the upper wiring layer due to defective coating will not occur.

As described above, in the embodiment, to form an interlayer insulating film, SiH$_4$ gas and H$_2$O$_2$ are introduced into a reaction chamber in which a semiconductor substrate provided with a lower wiring pattern is placed, and are reacted with each other under a negative pressure of 665 Pa or less at a temperature falling within a range from −10° C. to +10° C. (e.g. 0° C.), thereby forming a reflow SiO$_2$ film of a reflow configuration on the wiring pattern such that it does not completely cover the wiring pattern. After the reflow film-forming treatment, a plasma CVD insulating film is continuously deposited on the semiconductor substrate by plasma CVD under a predetermined negative pressure, and if necessary, the resultant structure is heated for 30 minutes or more at a high temperature of 400°–450° C.

The reflow SiO$_2$ film has a U-shaped cross section between each adjacent pair of the wires formed of the lower wiring layer because of its surface tension. When the plasma CVD insulating film is continuously deposited on the semiconductor substrate by the plasma CVD under a negative pressure in a state in which the reflow $SiO_2$ film of the U-shaped cross section is coated on lower side portions of the wires, a plasma CVD insulating film of high quality sufficiently grows even at the lower side portions of the wires since the supply of reactive gases thereto is promoted.

The resultant plasma CVD insulating film has a cross section consisting of smooth U-shaped sections connected to each other on a continuous basis.

Thus, the reflow $SiO_2$ film can prevent the wires from having insufficiently insulated lower side portions, and also prevent the insulating film from having overhanging cross sections.

As described above, the present invention can provide a highly planarised interlayer insulating film at low cost.

The plasma CVD insulating film-forming step can be modified as follows:

$SiH_4$ and $NH_3$ gases are mainly reacted with each other by plasma CVD at a temperature of 300° C.–400° C. to form a plasma CVD-SiN film; or TEOS (tetra-ethoxy-silane) and $O_2$ are mainly reacted with each other by plasma CVD at a temperature of 300° C.–400° C. to form a plasma CVD-$SiO_2$ film.

Although the interlayer insulating film is formed in the embodiment, the same advantage as above can be obtained if a top passivation film is formed by forming the reflow $SiO_2$ film and the plasma CVD insulating film. Further, in this case, moisture or alkali ions can be prevented from entering the LSI device from the outside thereof through an insufficiently insulated lower side portion of a wire provided under the top passivation film, and through the plasma CVD insulating film, thereby preventing degradation of the reliability of the device.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a semiconductor device having a multilayer wiring structure, in which the step of forming a insulating film for covering a wiring layer is improved, comprising the steps of:

forming a wiring pattern on an insulating film provided on a semiconductor substrate;

forming a reflow film by introducing $SiH_4$ gas and $H_2O_2$ into a reaction chamber in which the semiconductor substrate provided with the wiring pattern is placed, and by reacting them with each other under a negative pressure of 665 Pa or less and at a temperature falling within a range from −10° C. to +10° C., thereby forming a reflow $SiO_2$ film of a reflow configuration on the wiring pattern leaving side portions of the wiring pattern partially exposed; and forming a plasma CVD insulating film by depositing continuously the plasma CVD insulating film on the reflow $SiO_2$ film on the semiconductor substrate by plasma CVD under a negative such that the plasma CVD insulating film covers the partially exposed side portions of the wiring pattern pressure.

2. The method according to claim 1, wherein in the plasma CVD insulating film-forming step, $SiH_4$ gas and $N_2O$ gas are reacted with each other at a temperature falling within a range from 300° C. to 400° C., thereby forming a plasma CVD-$SiO_2$ film.

3. The method according to claim 1, wherein in the plasma CVD insulating film-forming step, $SiH_4$ gas and $NH_3$ gas are reacted with each other at a temperature falling within a range from 300° C. to 400° C., thereby forming a plasma CVD-SiN film.

4. The method according to claim 1, wherein in the plasma CVD insulating film-forming step, TEOS gas and $O_2$ gas are reacted with each other at a temperature falling within a range from 300° C. to 400° C., thereby forming a plasma CVD-$SiO_2$ film.

5. A method for manufacturing a semiconductor device having a multilayer wiring structure, in which the step of forming a insulating film for covering a wiring layer is improved, comprising the steps of:

forming a wiring pattern on an insulating film provided on a semiconductor substrate;

forming a reflow film by introducing $SiH_4$ gas and $H_2O_2$ into a reaction chamber in which the semiconductor substrate provided with the wiring pattern is placed, and by reacting them with each other under a negative pressure of 665 Pa or less and at a temperature falling within a range from −10° C. to +10° C., thereby forming a reflow $SiO_2$ film of a reflow configuration on the wiring pattern leaving side portions of the wiring pattern partially exposed;

forming a plasma CVD insulating film by depositing continuously the plasma CVD insulating film on the reflow $SiO_2$ film on the semiconductor substrate by plasma CVD under a negative such that the plasma CVD insulating film covers the partially exposed side portions of the wiring pattern pressure; and heating the resultant semiconductor substrate for 30 minutes or more at a high temperature falling within a range from 400° C. to 450° C.

6. The method according to claim 5, wherein in the plasma CVD insulating film-forming step, $SiH_4$ gas and $N_2O$ gas are reacted with each other at a temperature falling within a range from 300° C. to 400° C., thereby forming a plasma CVD-$SiO_2$ film.

7. The method according to claim 5, wherein in the plasma CVD insulating film-forming step, $SiH_4$ gas and $NH_3$ gas are reacted with each other at a temperature falling within a range from 300° C. to 400° C., thereby forming a plasma CVD-SiN film.

8. The method according to claim 5, wherein in the plasma CVD insulating film-forming step, TEOS gas and $O_2$ gas are reacted with each other at a temperature falling within a range from 300° C. to 400° C., thereby forming a plasma CVD-$SiO_2$ film.

* * * * *

UNITED STATES PATENT AND TRADEMARK OFFICE
CERTIFICATE OF CORRECTION

PATENT NO. : 5,650,360
DATED : July 22, 1997
INVENTOR(S) : Ken-ichi TOMITA

It is certified that error appears in the above-indentified patent and that said Letters Patent is hereby corrected as shown below:

Claim 1, column 5, line 46, "a insulating" should read --an insulating--.

Claim 1, column 6, line 2, after "negative", insert --pressure--.

Claim 1, column 6, line 4, after "pattern", delete "pressure".

Claim 5, column 6, line 22, "a insulating" should read --an insulating--.

Claim 5, column 6, line 39, after "negative", insert --pressure--.

UNITED STATES PATENT AND TRADEMARK OFFICE
CERTIFICATE OF CORRECTION

PATENT NO. : 5,650,360
DATED : July 22, 1997
INVENTOR(S) : Ken-ichi TOMITA

It is certified that error appears in the above-identified patent and that said Letters Patent is hereby corrected as shown below:

Claim 5, column 6, line 41, after "pattern", delete "pressure".

Signed and Sealed this

Sixteenth Day of December, 1997

Attest:

BRUCE LEHMAN

Attesting Officer

Commissioner of Patents and Trademarks